(12) United States Patent
Lin et al.

(10) Patent No.: US 10,996,119 B1
(45) Date of Patent: May 4, 2021

(54) FILM PRESSURE SENSING DEVICE AND PRESSURE SENSING SYSTEM FOR EXERCISE EQUIPMENT

(71) Applicant: Institute For Information Industry, Taipei (TW)

(72) Inventors: Tse-Yu Lin, Taipei (TW); An-Chun Chen, Taipei (TW); Yu-Chen Cheng, Taipei (TW); Heng-Yi Chen, Taipei (TW)

(73) Assignee: Institute For Information Industry, Taipei (TW)

( * ) Notice: Subject to any disclaimer, the term of this patent is extended or adjusted under 35 U.S.C. 154(b) by 0 days.

(21) Appl. No.: 16/697,125

(22) Filed: Nov. 26, 2019

(30) Foreign Application Priority Data

Nov. 5, 2019 (TW) .................. 10814010.6

(51) Int. Cl.
  *G01L 1/14* (2006.01)
  *A63B 22/06* (2006.01)
  *A63B 24/00* (2006.01)

(52) U.S. Cl.
  CPC .......... *G01L 1/142* (2013.01); *A63B 22/0605* (2013.01); *A63B 2024/009* (2013.01);
  (Continued)

(58) Field of Classification Search
  CPC ................ G01L 1/142; A63B 22/0605; A63B 2024/009; A63B 2220/56; H05K 2201/10151
  (Continued)

(56) References Cited

U.S. PATENT DOCUMENTS

| 8,678,958 B2 | 3/2014 | Kuwabara |
| 10,034,622 B1 | 7/2018 | Mahmoud |

(Continued)

FOREIGN PATENT DOCUMENTS

| TW | 351990 | 2/1999 |
| TW | 201515636 A | 5/2015 |

OTHER PUBLICATIONS

Office Action to the corresponding Taiwan Patent Application rendered by the Taiwan Intellectual Property Office (TIPO) dated Jul. 16, 2020, 16 pages (including English translation).
(Continued)

*Primary Examiner* — Max H Noori
(74) *Attorney, Agent, or Firm* — Skaar Ulbrich Macari, P.A.

(57) ABSTRACT

A film pressure sensing device and a pressure sensing system for an exercise equipment are provided. The pressure sensing system includes an electronic device and at least one film pressure sensing device. Each film pressure sensing device includes a film sensing module and a processing module. The film sensing module includes a plurality of film pressure sensing elements, each of which senses pressure on a specific position of the exercise equipment to generate a pressure sensing signal. The processing module connects to the film pressure sensing elements via a plurality of conducting wires to receive the pressure sensing signals. The processing module generates a sensing data according to the pressure sensing signals, and transmits the sensing data to the electronic device. The film sensing module is flexible to be tightly disposed on a component of the exercise equipment, where the component corresponds to a part of a user's body.

16 Claims, 9 Drawing Sheets

(52) U.S. Cl.
CPC .............. *A63B 2220/56* (2013.01); *H05K 2201/10151* (2013.01)

(58) Field of Classification Search
USPC .................................. 73/862.626
See application file for complete search history.

(56) References Cited

U.S. PATENT DOCUMENTS

| | | | |
|---|---|---|---|
| 10,322,315 B2 | 6/2019 | Foley et al. | |
| 2011/0284304 A1* | 11/2011 | Van Schoiack | B62D 1/046 |
| | | | 180/272 |
| 2014/0366650 A1* | 12/2014 | Thillainadarajah | A63B 69/36 |
| | | | 73/862.625 |
| 2015/0025816 A1* | 1/2015 | Ross | A43B 17/00 |
| | | | 702/44 |
| 2016/0066821 A1 | 3/2016 | Mestrovic et al. | |
| 2016/0299021 A1* | 10/2016 | Thillainadarajah | G01L 5/16 |
| 2019/0014857 A1* | 1/2019 | Mayrhofer | A63B 24/0062 |
| 2019/0060735 A1 | 2/2019 | Wu | |
| 2019/0175107 A1* | 6/2019 | Lu | A61B 5/6807 |
| 2019/0184234 A1 | 6/2019 | Packles et al. | |

OTHER PUBLICATIONS

Office Action to the corresponding Taiwan Patent Application rendered by the Taiwan Intellectual Property Office (TIPO) dated Oct. 21, 2020, 11 pages (including English translation).

\* cited by examiner

FILM PRESSURE SENSING DEVICE AND PRESSURE SENSING SYSTEM FOR EXERCISE EQUIPMENT

PRIORITY

This application claims priority to Taiwan Patent Application No. 108140106 filed on Nov. 5, 2019, which is hereby incorporated by reference in its entirety.

FIELD

The present invention relates to a film pressure sensing device and a pressure sensing system for an exercise equipment. Specifically, the film pressure sensing device of the present invention may be installed on a component of an exercise equipment to sense pressure generated by a user contacting the component, generate a sensing data in response to the sensed pressure, and transmit the sensing data to an electronic device, thereby controlling an application program executed on the electronic device by operating the exercise equipment.

BACKGROUND

With the change of social style, indoor exercising have become more and more popular in recent years, and people have paid more attention to various demands of indoor exercising. For indoor exercising, most people choose to exercise in the gym, sports center or at home with their own exercise equipment. However, the exercise equipment currently in use is mostly limited to data sharing or video chatting between users, but does not provide motion sensing interactive applications in real-time. Gradually, users may lose their motivation to exercise with indoor exercise equipment as time goes by. Although, replacing the existing exercise equipment with new equipment providing built-in motion sensing function might help the previously mentioned problem, home users or gym operators would have to bear extra high costs accompanied with recycling issues for the replaced exercise equipment.

Accordingly, an urgent need exists in the art to improve the intelligent function of the exercise equipment at low cost and without replacing the exercise equipment, thereby increasing the user's motivation to use the exercise equipment.

SUMMARY

Provided is a low-cost and highly interactive reconstruction scheme so that users can have real-time motion sensing interactive applications without replacing exercise equipment. Therefore, users are provided with new interactive experience without replacing the old exercise equipment, and the users' motivation to use the exercise equipment is increased.

The disclosure includes a film pressure sensing device for an exercise equipment, which comprises a film sensing module and a processing module. The film sensing module comprises a plurality of film pressure sensing elements. Each of the film pressure sensing elements is used for sensing pressure on a specific position of the exercise equipment to generate a pressure sensing signal. The processing module is electrically connected to the film pressure sensing elements via a plurality of conducting wires, and is configured to receive the pressure sensing signals, generate a sensing data according to the pressure sensing signals, and transmit the sensing data to an electronic device. The film sensing module is flexible to be tightly disposed on a component of the exercise equipment, and the component corresponds to a part of a user's body.

Also disclosed is a pressure sensing system for an exercise equipment, which comprises an electronic device and at least one film pressure sensing device. Each of the at least one film pressure sensing device comprises a film sensing module and a processing module. The film sensing module comprises a plurality of film pressure sensing elements. Each of the film pressure sensing elements is used for sensing pressure on a specific position of the exercise equipment to generate a pressure sensing signal. The processing module is electrically connected to the film pressure sensing elements via a plurality of conducting wires, and is configured to receive the pressure sensing signals, generate a sensing data according to the pressure sensing signals, and transmit the sensing data to the electronic device. The film sensing module of each of the at least one film pressure sensing device is flexible to be tightly disposed on a component of the exercise equipment, and the component corresponds to a part of a user's body.

The detailed technology and preferred embodiments implemented for the subject invention are described in the following paragraphs accompanying the appended drawings for people skilled in this field to well appreciate the features of the claimed invention.

DETAILED DESCRIPTION

In the following description, the present invention will be explained with reference to certain example embodiments thereof, and these example embodiments are not intended to limit the present invention to any particular environment, example, embodiment, applications or implementations described in these example embodiments. Therefore, description of these example embodiments is only for purpose of illustration rather than to limit the present invention.

It shall be appreciated that, in the following embodiments and the attached drawings, elements unrelated to the present invention are omitted from depiction; and dimensional relationships among individual elements in the attached drawings are illustrated only for ease of understanding, but not to limit the actual scale.

Figure 1:
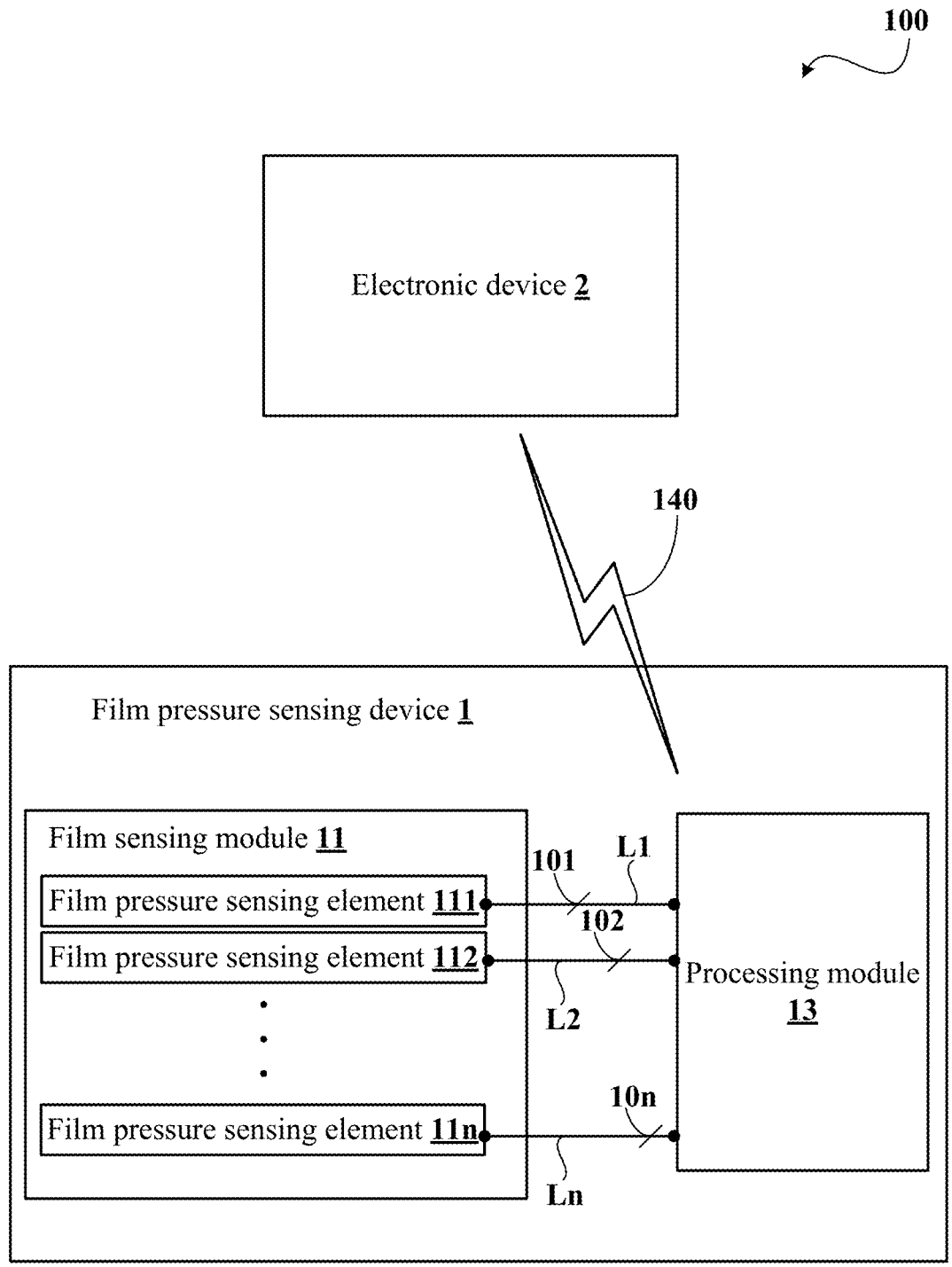
FIG. 1 depicts a schematic view of a pressure sensing system 100 for an exercise equipment 300 according to the present invention.
Figure 2:
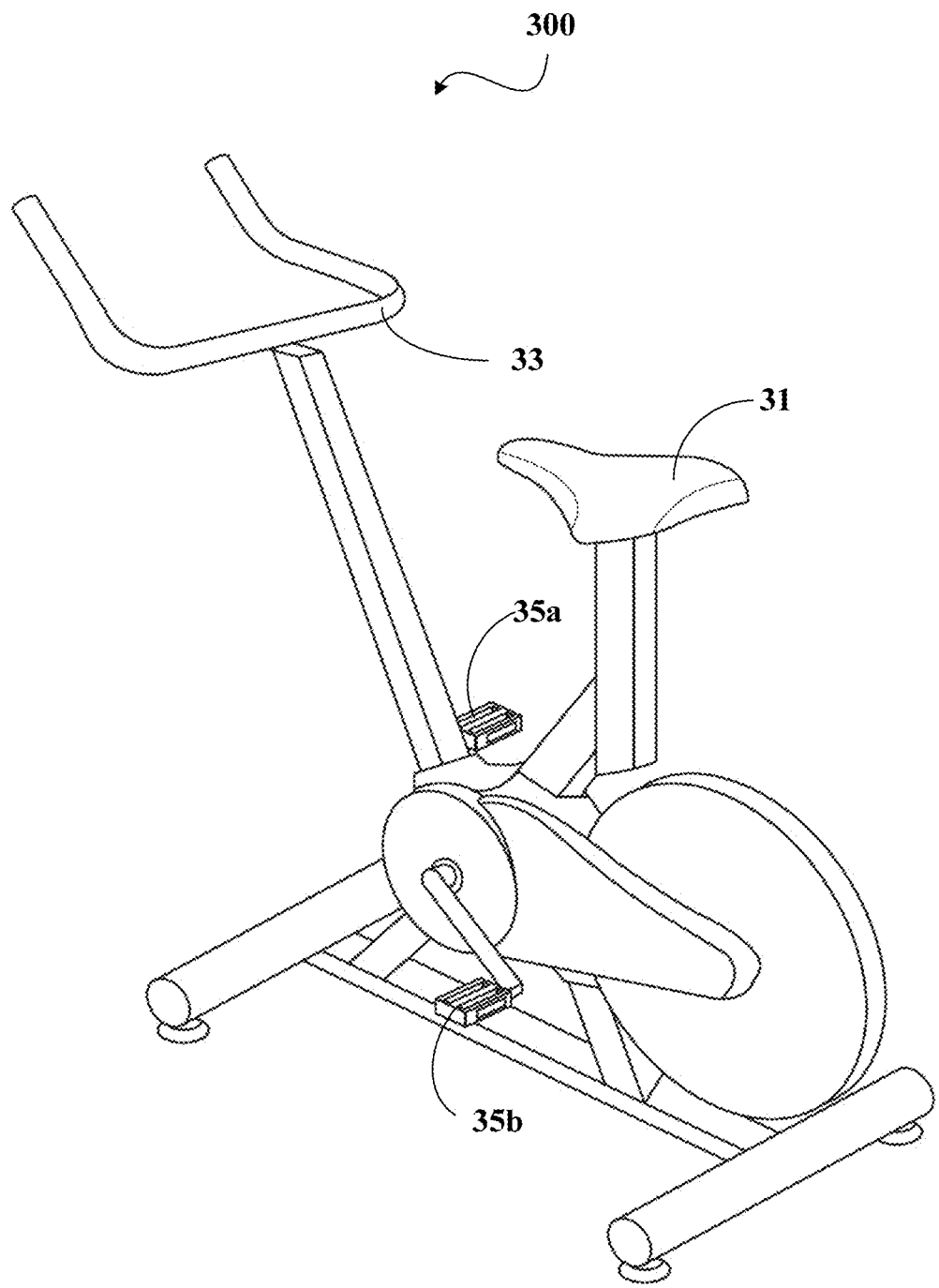
FIG. 2 depicts a schematic view of a piece of exercise equipment 300.

Please refer to FIG. 1 and FIG. 2 for a first embodiment of the present invention. FIG. 1 depicts a pressure sensing system 100 for a piece of exercise equipment 300. The exercise equipment 300 may be a flywheel bike as shown in FIG. 2. However, in other implementation situations, the pressure sensing system 100 of the present invention may be applied to other exercise equipment (e.g., a recumbent exercise bicycle, an upright exercise bicycle/bike, an elliptical machine, a stair-master, a balancing plate, a rowing machine, etc.), and how to apply the pressure sensing system 100 of the present invention to other exercise equipment shall be easily appreciated by those of ordinary skill in the art based on description of the following embodiments.

The pressure sensing system 100 comprises one or more film pressure sensing devices 1 and an electronic device 2. Due to layout limitation and for simplicity of explanation, FIG. 1 only depicts one film pressure sensing device 1 as an example. The electronic device 2 may be a tablet computer, a smart phone, a laptop, a smart TV, or a video output device with HDMI (e.g., a TV box or a TV stick). The film pressure sensing device 1 comprises a film sensing module 11 and a processing module 13. The film sensing module 11 comprises a plurality of film pressure sensing elements 111-11$n$, where n is a positive integer. Each of the film pressure sensing elements 111-11$n$ is used to sense pressure on a specific position of the exercise equipment 300 to generate a pressure sensing signal (for example: the film pressure sensing element 111 generates a pressure sensing signal 101, the film pressure sensing element 112 generates a pressure sensing signal 102, and the film pressure sensing element 11$n$ generates a pressure sensing signal 10$n$). In a preferred embodiment, each of the film pressure sensing elements 111-11$n$ may be a capacitive pressure sensing element (not limited thereto). In other embodiments, the film pressure sensing elements 111-11$n$ may also adopt a resistive pressure sensing element or other types of film pressure sensing elements.

The processing module 13 is electrically connected to the film pressure sensing elements 111-11$n$ via a plurality of conducting wires L1-L$n$, and is configured to receive the pressure sensing signals 101-10$n$. The processing module 13 generates a sensing data 140 according to the pressure sensing signals 101-10$n$ and transmits the sensing data 140 to the electronic device 2. The sensing data 140 may include pressure values sensed by each of the film pressure sensing elements 111-11$n$ (e.g., quantized values of changes of capacitance values). It shall be emphasized that, the film sensing module 11 of the film pressure sensing device 1 of the present invention is flexible and the thickness thereof may be less than 1.4 mm, so the film sensing module 11 may be tightly disposed on a component of the exercise equipment 300. The component of the exercise equipment 300 corresponds to a part of a user's body. For example, the component may be a saddle 31, a handlebar 33 or foot pedals 35$a$ and 35$b$. Therefore, the specific position on the exercise equipment 300 described above may be a position on one of a saddle 31, a handlebar 33 and foot pedals 35$a$ and 35$b$ of the exercise equipment 300.

The handlebar of the exercise equipment 300 may have a plurality of specific positions, for example, a left upper handlebar, a left flat handlebar, a right upper handlebar, a right flat handlebar, and other different positions. Multiple groups of the film sensing modules 11 of the present invention may be simultaneously installed respectively on different positions (e.g., the saddle 31, a plurality of handlebar positions, and the foot pedals 35$a$ and 35$b$, etc.) of the exercise equipment 300. In some embodiments, the film sensing module 11 may be designed with an installation kit that is convenient for installation according to different position requirements. For example, a seat cushion is designed for the saddle 31 and the film pressure sensing elements 111-11$n$ are arranged on front, middle, left, right and other positions of the seat cushion, or a handlebar sleeve that is elastic and convenient for disassembly is designed for the handlebar position, and the film pressure sensing elements 111-11$n$ are arranged on positions where the handlebar sleeve may be grasped by hands of a person.

Figure 3A:
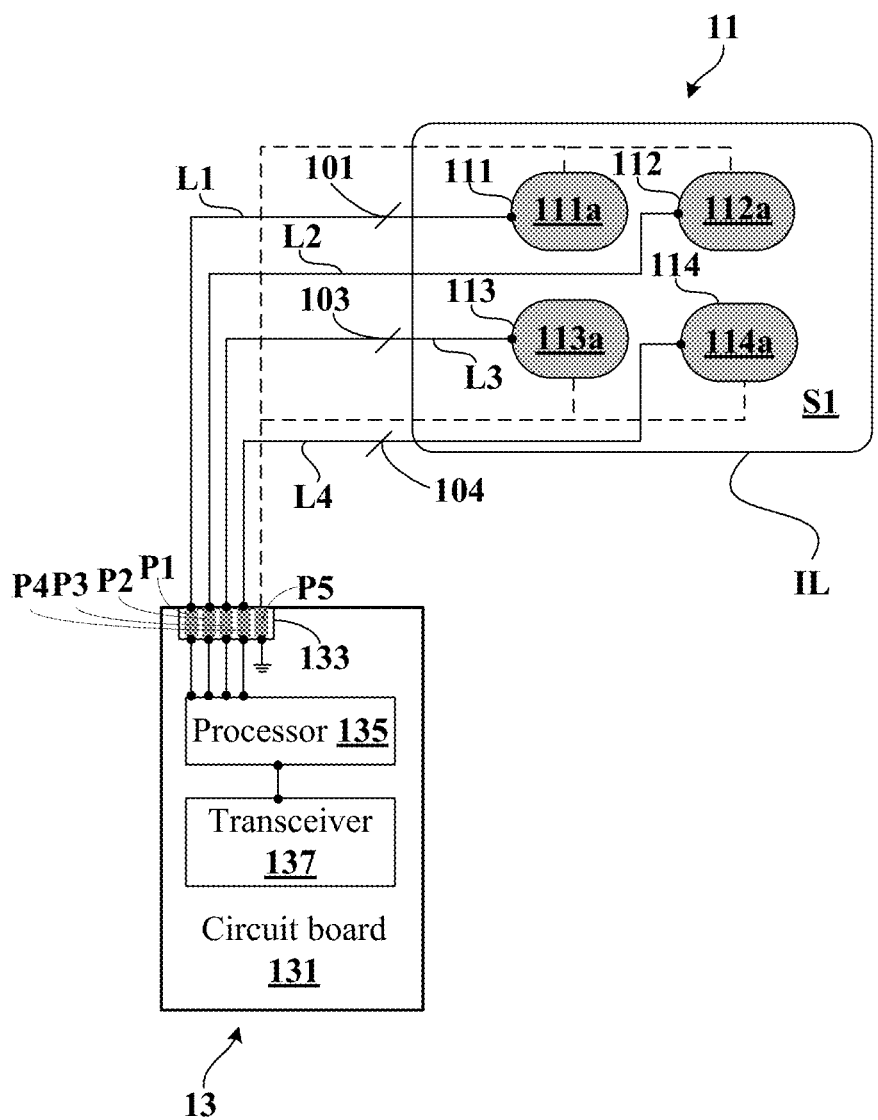
FIGS. 3A-3B depict schematic views of a film pressure sensing device 1 for a foot pedal 35a or a foot pedal 35b according to the present invention.
Figure 3B:
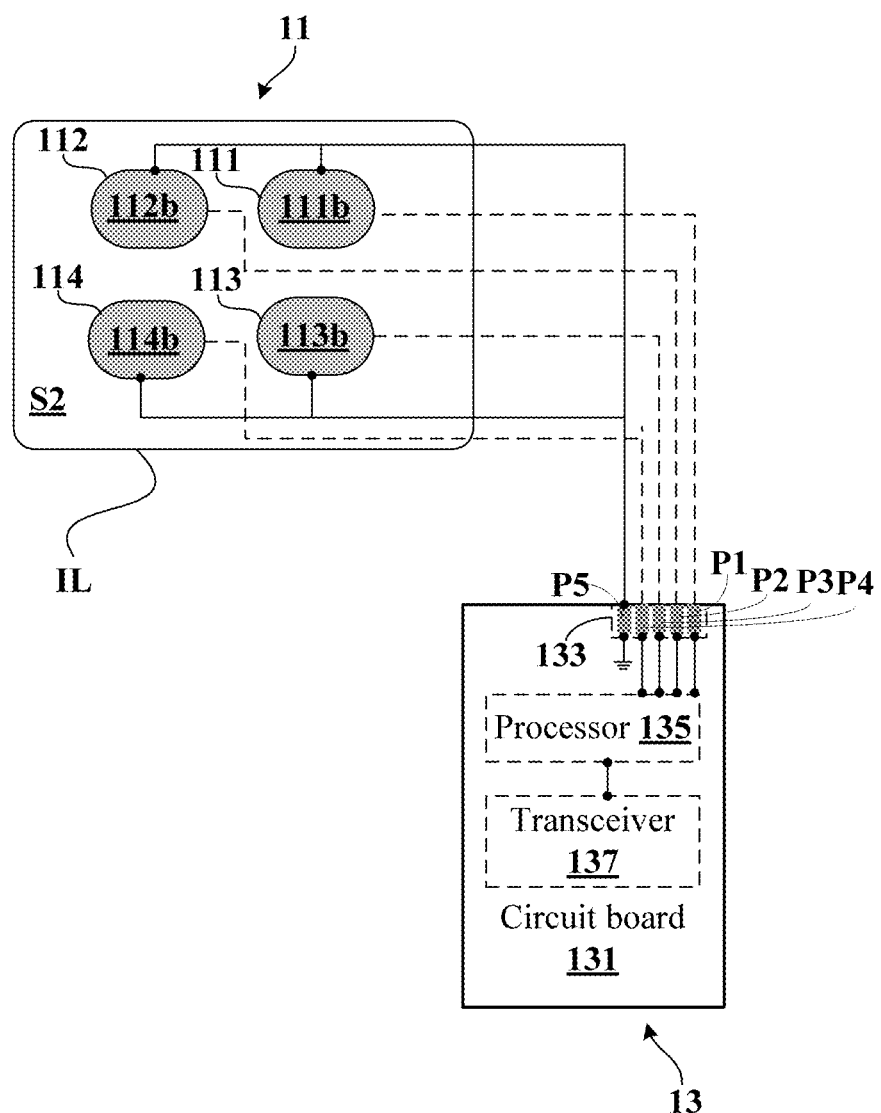

For example, FIG. 3A to FIG. 3B depict schematic views of the film pressure sensing device 1 for the foot pedal 35$a$ or the foot pedal 35$b$. FIG. 3A is a top view and FIG. 3B is a bottom view. The processing module 13 comprises a circuit board 131, an input/output (I/O) interface 133, a transceiver 137 and a processor 135. The I/O interface 133, the transceiver 137 and the processor 135 are all disposed on circuit board 131. The processor 135 is electrically connected to the I/O interface 133 and the transceiver 137.

The processor 13 may be any of various processors, central processing units (CPUs), microprocessors, digital signal processors, or other computing devices known to those of ordinary skill in the art. Transceiver 137 may be a Bluetooth transceiver or any short-range communication transceiver. Therefore, a user can construct the pressure sensing system 100 of the present invention simply by pairing and connecting the film pressure sensing device 1 and the electronic device 2 (e.g., through Bluetooth pairing).

The I/O interface 133 has a plurality of VCC (Voltage Common Collector) pins P1-P4 and a GND (ground) pin P5 to be electrically connected to the film pressure sensing elements 111-114 via conducting wires L1, L2, L3, L4 and LG. The processor 135 receives the pressure sensing signals 101-104 from the film sensing elements 111-114 through the I/O interface 133, and generates sensing data 104 according to the pressure sensing signals 101-104. Next, the processor 135 transmits the sensing data 104 to the electronic device 2 through the transceiver 137.

The film sensing module 11 further comprises an insulating layer IL. The insulating layer IL may be a PET shrink film. The insulating layer IL has a first surface S1 and a second surface S2. The film pressure sensing elements 111-114 respectively have first conductive layers 111$a$, 112$a$, 113$a$ and 114$a$ disposed on the first surface S1 of the insulating layer IL and second conductive layers 111$b$, 112$b$, 113$b$ and 114$b$ disposed on the second surface S2 opposite to the first conductive layers 111$a$, 112$a$, 113$a$ and 114$a$. The first conductive layers 111$a$, 112$a$, 113$a$ and 114$a$ of the film pressure sensing elements 111-114 are electrically connected to the VCC pins P1-P4 respectively, and the second conductive layers 111$b$, 112$b$, 113$b$ and 114$b$ of the film pressure sensing elements 111-114 are electrically connected to the GND pin P5.

In this embodiment, the first conductive layers 111$a$, 112$a$, 113$a$ and 114$a$, the second conductive layers 111$b$, 112$b$, 113$b$ and 114$b$ as well as the conducting wires L1, L2, L3, L4, and LG of the present invention may be formed by printing conductive silver paste. However, as shall be appreciated by those of ordinary skill in the art, in other embodiments, the first conductive layers 111$a$, 112$a$, 113$a$ and 114$a$, the second conductive layers 111$b$, 112$b$, 113$b$ and 114$b$ as well as the conducting wires L1, L2, L3, L4 and LG of the present invention may also be formed by printing other conductive materials (e.g., conductive ink).

Figure 4:
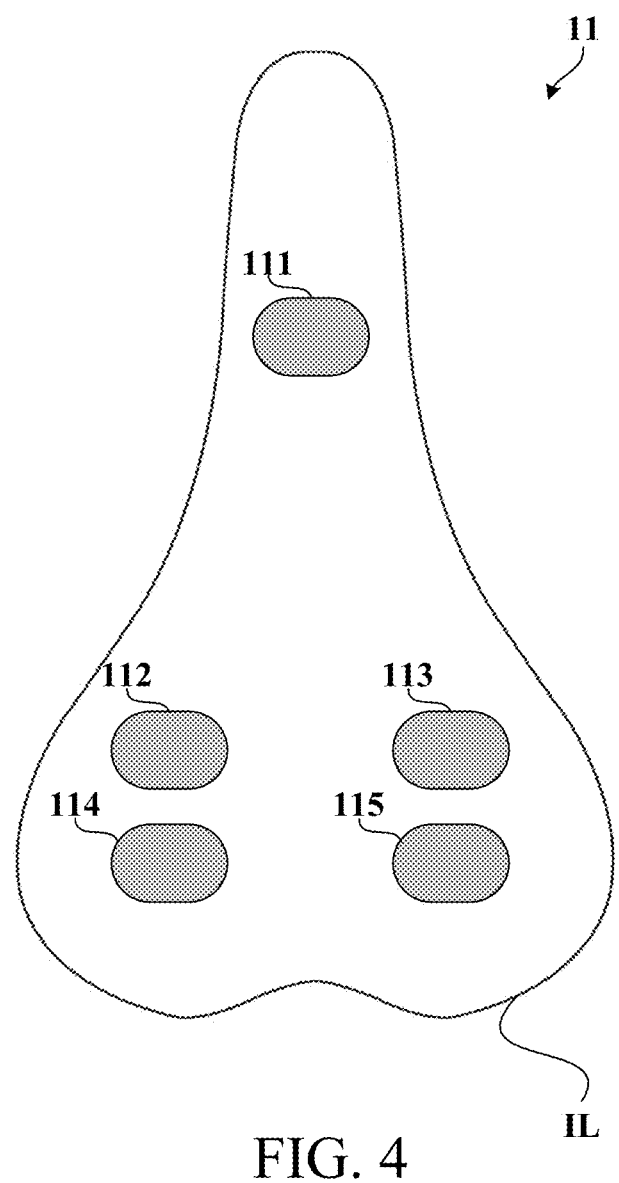
FIG. 4 depicts a schematic view of a film sensing module 11 of the film pressure sensing device 1 for a saddle 31 according to the present invention.
Figure 5:
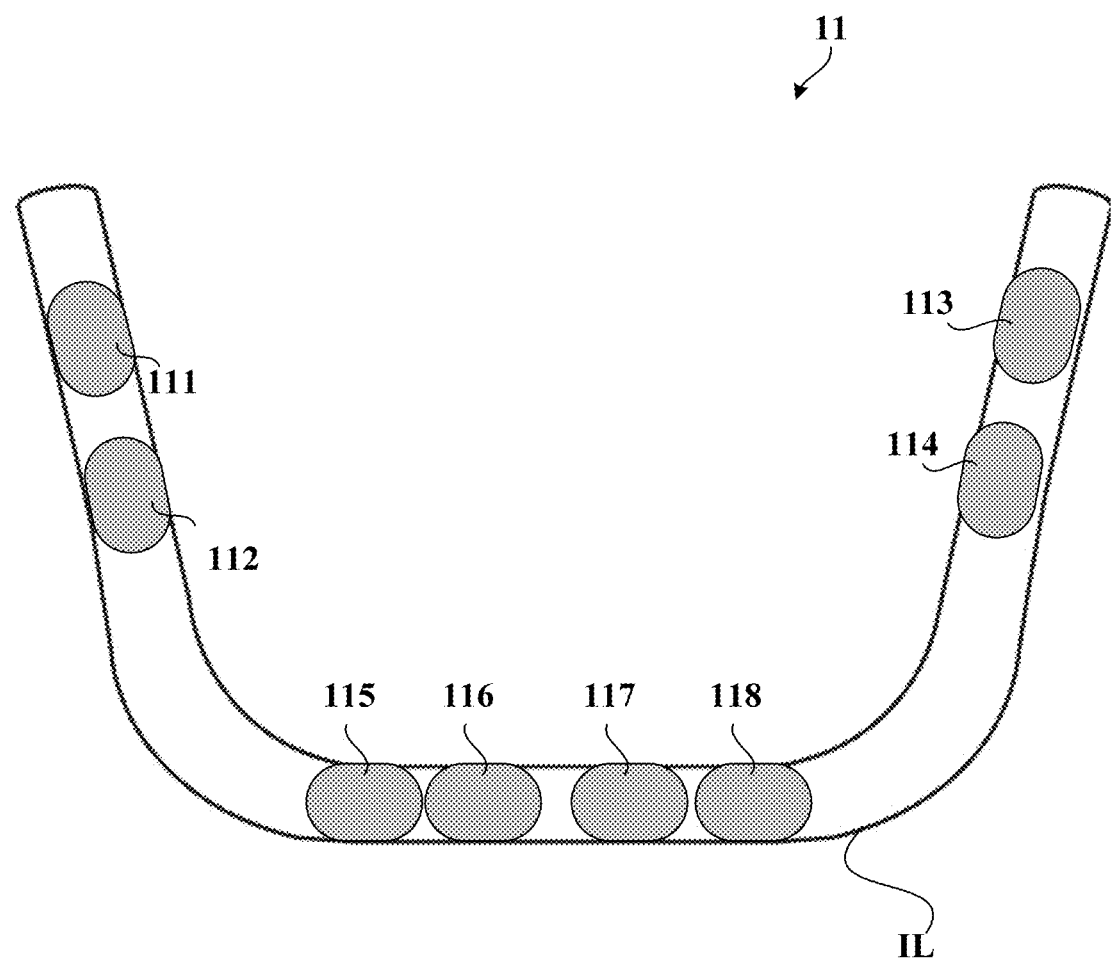
FIG. 5 depicts a schematic view of the film sensing module 11 of the film pressure sensing device 1 for a handlebar 33 according to the present invention.

Moreover, FIG. 4 depicts a schematic view of the film sensing module 11 of the film pressure sensing device 1 for the saddle 31. For simplicity of the description, FIG. 4 only describes the shape of the film sensing module 11 and the film pressure sensing elements 111-115 included therein, and the electrical connection and structure thereof are omitted from depiction. Similarly, FIG. 5 depicts a schematic view of the film sensing module 11 of the film pressure sensing device 1 for the handlebar 33. Likewise, for simplicity of the description, FIG. 5 only describes the shape of the film sensing module 11 and the film pressure sensing elements 111-118 included therein, and the electrical connection and structure thereof are omitted from depiction.

It shall be noted that, the shapes of the film sensing modules 11 depicted in FIGS. 3A-3B, FIG. 4 and FIG. 5 and the number of film pressure sensing elements included therein are merely examples and are not intended to limit the present invention. As shall be appreciated by those of ordinary skill in the art, the shape of the film sensing module 11 of the present invention may be tailored based on various components of the exercise equipment 300, and the number of the film pressure sensing elements included in the film sensing module 11 may be determined based on the user's operations of the exercise equipment 300 and the contact conditions on these components.

In an embodiment, the film sensing module 11 may further comprise an anti-interference layer. The anti-interference layer may also be formed by printing conductive silver paste and formed into a net shape. The anti-interference layer is configured to cover the second conductive layers of the pressure sensing elements and is electrically connected to the GND pin to form a ground net.

In an embodiment, the film sensing module 11 may further comprise a encapsulation layer. The encapsulation layer is used to encase the insulating layer, the pressure sensing elements and the anti-interference layer to increase the protection or beauty of the outer layer of the film sensing module 11. The encapsulation layer may be formed from any insulating material.

Figure 6A:
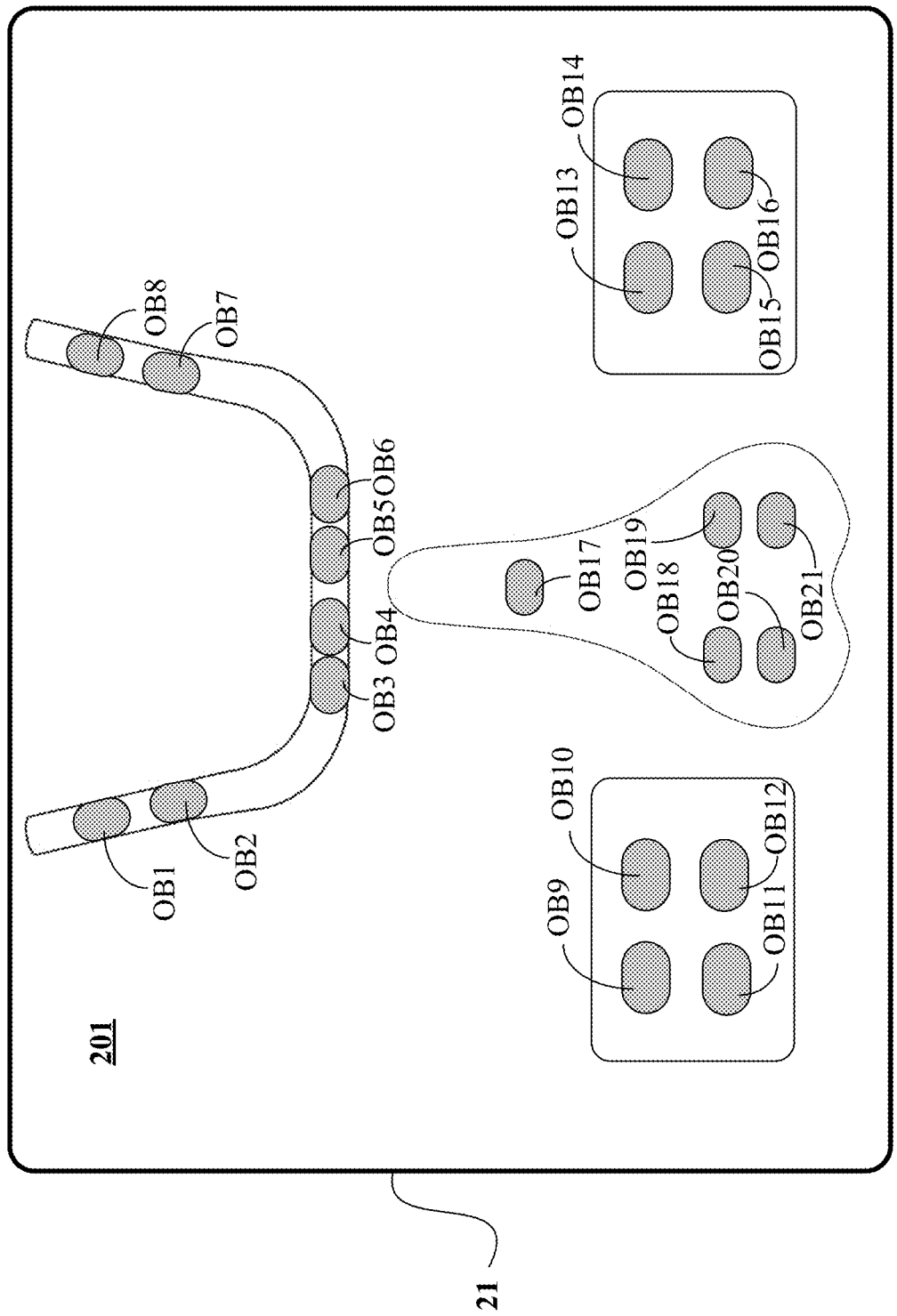
FIGS. 6A-6B are schematic views depicting an electronic device 2 of the present invention outputting a calibration image 201 in a display interface 21.
Figure 6B:
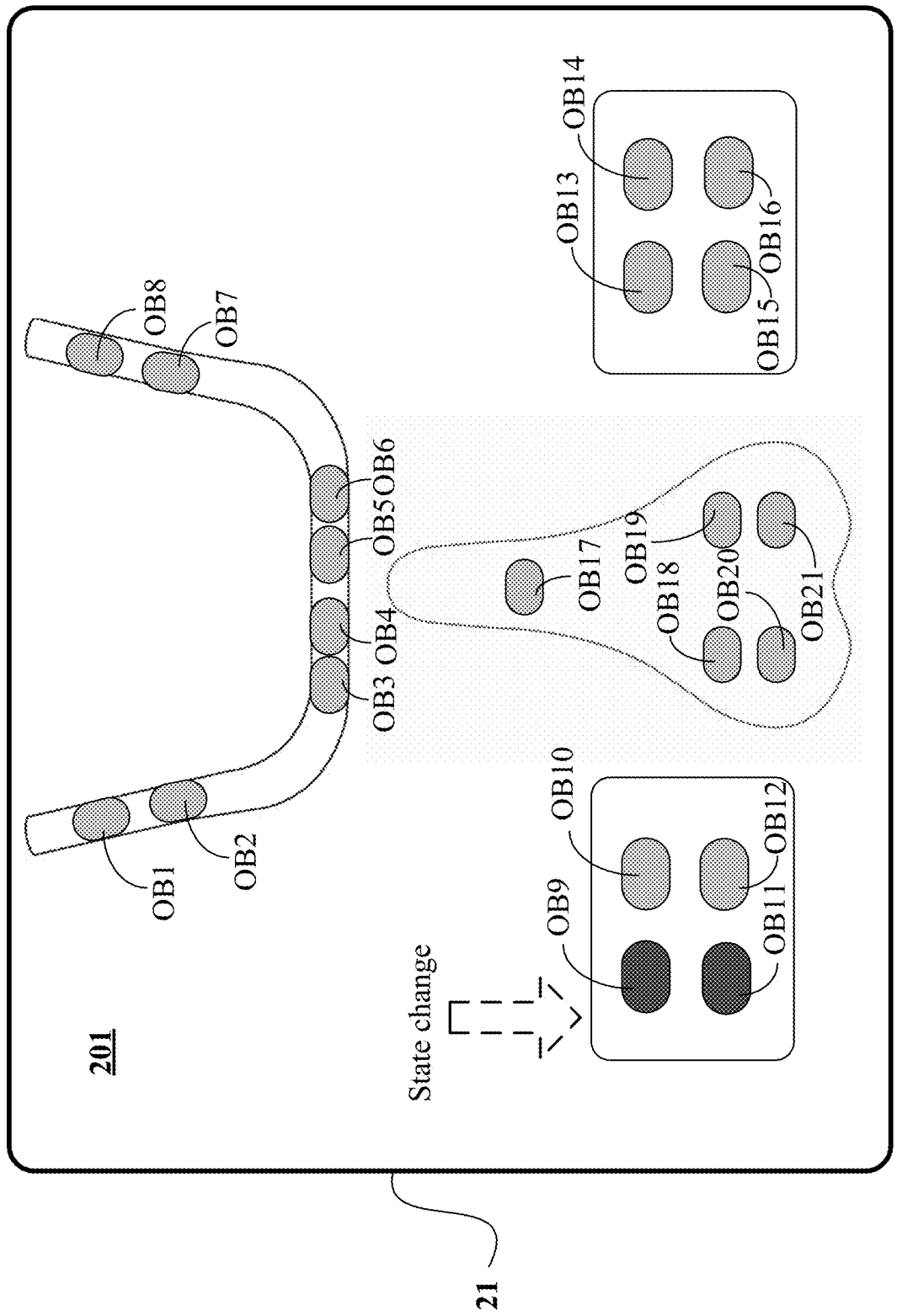

Please refer to FIGS. 6A-6B for a second embodiment of the present invention. This embodiment illustrates the process of confirming whether the installation position of each film sensing module is correct and correcting the position thereof after the film sensing modules 11 are installed to the exercise equipment 300. The electronic device 2 has a display interface 21 (e.g., a display panel) to output a calibration image 201. As shown in FIG. 6A, the calibration image 201 shows each of objects OB1-OB21 on each specific position of the exercise equipment 300 corresponding to every film pressure sensing element (e.g., the aforementioned film pressure sensing elements of the film sensing modules 11 on the saddle 31, the handlebar 33, and the foot pedals 35a and 35b).

When each film pressure sensing element senses pressure to generate a pressure sensing signal, the display interface 21 changes the state of the corresponding object on the calibration image 201. For example, as shown in FIG. 6B, when the film pressure sensing elements, corresponding to the objects OB9 and OB11, of the left foot pedal 35b of the exercise equipment 300 sensed pressure in response to the pedaling from the user, the display interface 21 changes the state of the objects OB9 and OB11 on the calibration image 201 (e.g., changes the display color). Therefore, by providing the calibration image 201, the present invention may enable the user to confirm whether the film sensing module 11 of each film pressure sensing device 1 is correctly and tightly disposed on the corresponding component of the exercise equipment 300 and perform calibration.

Figure 7:
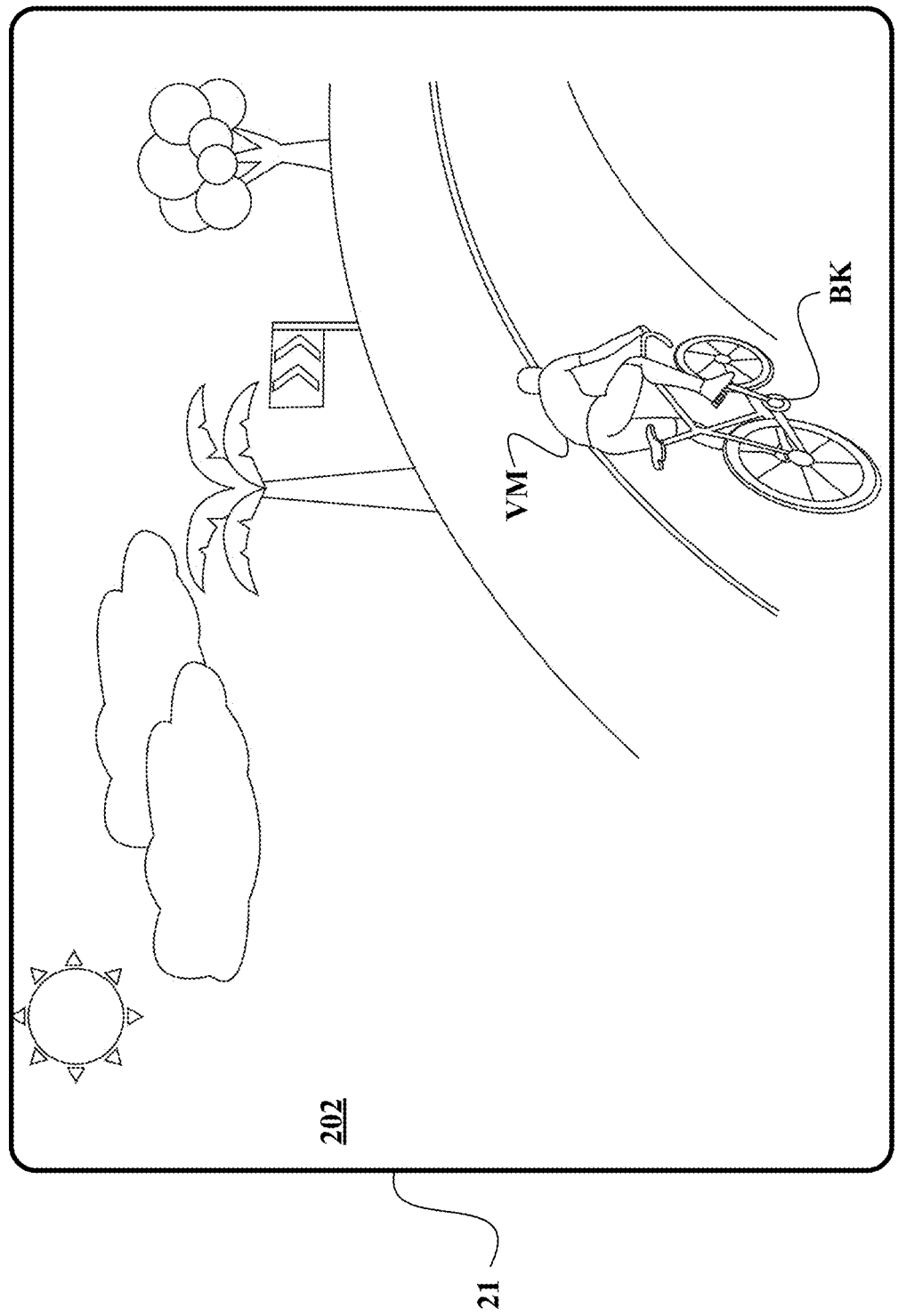
FIG. 7 is a schematic view depicting an animation 202 generated by an application program executed on the electronic device 2 according to the present invention.

Please refer to FIG. 7 for a third embodiment. The pressure sensing system 100 of the present invention may have interactive applications. In this embodiment, the electronic device 2 executes an application program. The application program may be a game program, an interactive program or the like. The application program may generate a control command to control the operation of the application program according to the sensing data 140 received from each film pressure sensing device 1.

For example, the application program may generate an animation 202 for a moving bike BK and is displayed in the display interface 21 and may accept the control command of the application program for operation. As mentioned above, the sensing data 140 may include pressure values sensed by each of the film pressure sensing elements 111-11n. Therefore, according to the sensing data 140 received from each film pressure sensing device 1, the application program may generate a control command to control a turning angle of the moving bike BK in the animation 202. It is conceivable that when the film pressure sensing device 1 installed on the left foot pedal 35b senses a larger pressure as compared to the film pressure sensing device 1 installed on the right foot pedal 35a, the control command generated by the application program controls the bike BK to turn left, and the turning angle to turn left may be calculated according to the difference between the two pressures.

For another example, similarly, the animation 202 may also show other characteristics of the moving bike BK. For example, according to the sensing data 140 received from each film pressure sensing device 1, the application program may generate a control command to control a lean angle when the moving bike BK is turning. Similarly, it is conceivable that when the film pressure sensing device 1 installed on the left foot pedal 35b senses a larger pressure as compared to the film pressure sensing device 1 installed on the right foot pedal 35a, the control command generated by the application program controls the moving bike BK to lean to the left, and the lean angle to the left may be calculated according to the difference between the two pressures.

In addition, in the above exemplary example, when the film pressure sensing device installed on the exercise equipment 300 senses different pressure distributions, the application program may generate different control commands to make a virtual person VM riding the bike BK in the animation show corresponding actions or postures. For example, when the film pressure sensing element on the saddle 31 has not sensed pressure but the film pressure sensing elements of the foot pedals 35a and 35b has sensed pressure, the virtual person VM riding the bike BK in the animation may show a standing riding posture; and when the film pressure sensing element on the saddle 31 has sensed pressure, the virtual person VM riding the bike BK in the animation may show a sitting posture. It shall be noted that, the animation 202 generated by the application program in this embodiment is illustrated by showing the moving bike BK. However, in other embodiments, the animation 202 generated by the application program may also provide users with various choices when being applied to different exercise equipment 300, e.g., a moving motorcycle or a virtual person who is climbing a mountain.

According to the above descriptions, the film pressure sensing device 1 of the present invention may be installed on various exercise equipment 300 and used in combination with specific electronic devices 2 (e.g., a tablet and a smart TV) to construct the pressure sensing system 100 of the present invention. By executing the application program and receiving the sensing data 140 from the film pressure sensing device 1 by the electronic device 2, the present invention may enable users to have real-time motion sensing interactive applications without replacing exercise equipment. Therefore, the present invention not only enables users to have new interactive experience without replacing the old exercise equipment, but also increases the users' motivation to use the exercise equipment.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A film pressure sensing device for exercise equipment, comprising:
   a film sensing module, comprising a plurality of film pressure sensing elements, each of the film pressure sensing elements being used for sensing pressure on a specific position of the exercise equipment to generate a pressure sensing signal; and
   a processing module, being electrically connected to the film pressure sensing elements via a plurality of conducting wires, and being configured to receive the pressure sensing signals, generate a sensing data according to the pressure sensing signals, and transmit the sensing data to an electronic device,
   wherein the film sensing module is flexible to be tightly disposed on a component of the exercise equipment, the exercise equipment is a flywheel bike, and the component is one of a saddle, a handlebar and a foot pedal of the flywheel bike, and corresponds to a part of a user's body;
   wherein the electronic device has a display interface to output a calibration image, the calibration image shows an object corresponding to the specific position on the exercise equipment corresponding to each of the film pressure sensing elements, and when each of the film pressure sensing elements senses the pressure to generate the pressure sensing signal, the display interface changes a state of the corresponding object on the calibration image.

2. The film pressure sensing device of claim 1, wherein the processing module further comprises:
   a circuit board;
   an input/output (I/O) interface, being disposed on the circuit board and having a plurality of VCC pins and a GND pin to be electrically connected to the film pressure sensing elements via the conducting wires;
   a transceiver, being disposed on the circuit board; and
   a processor, being disposed on the circuit board and electrically connected to the I/O interface and the transceiver, and being configured to receive the pressure sensing signals from the film sensing elements through the I/O interface, generate the sensing data according to the pressure sensing signals, and transmit the sensing data to the electronic device through the transceiver.

3. The film pressure sensing device of claim 2, wherein the film sensing module further comprises an insulating layer, the insulating layer has a first surface and a second surface, each of the film pressure sensing elements has a first conductive layer disposed on the first surface of the insulating layer and a second conductive layer disposed on the second surface opposite to the first conductive layer, the first conductive layer of each of the film pressure sensing elements is electrically connected to one of the VCC pins, and the second conductive layer of each of the film pressure sensing elements is electrically connected to the GND pin.

4. The film pressure sensing device of claim 2, wherein the transceiver is a Bluetooth transceiver.

5. The film pressure sensing device of claim 1, wherein each of the film pressure sensing elements is a capacitive pressure sensing element.

6. The film pressure sensing device of claim 1, wherein the electronic device executes an application program, and the application program generates a control command according to the sensing data.

7. The film pressure sensing device of claim 6, wherein the application program of the electronic device generates an animation for a moving bike, and the control command is used to control a turning angle of the moving bike.

8. The film pressure sensing device of claim 6, wherein the application program of the electronic device generates an animation for a moving bike, and the control command is used to control a lean angle of the moving bike when the bike is turning.

9. A pressure sensing system for an exercise equipment, comprising:
   an electronic device; and
   at least one film pressure sensing device, wherein each of the at least one film pressure sensing device comprises:
      a film sensing module, comprising a plurality of film pressure sensing elements, each of the film pressure sensing elements being used for sensing pressure on a specific position of the exercise equipment to generate a pressure sensing signal; and
      a processing module, being electrically connected to the film pressure sensing elements via a plurality of conducting wires, and being configured to receive the pressure sensing signals, generate a sensing data according to the pressure sensing signals, and transmit the sensing data to the electronic device,
   wherein the film sensing module of each of the at least one film pressure sensing device is flexible to be tightly disposed on a component of the exercise equipment, the exercise equipment is a flywheel bike, and the component is one of a saddle, a handlebar and a foot pedal of the flywheel bike, and corresponds to a part of a user's body;
   wherein the electronic device has a display interface to output a calibration image, the calibration image shows an object corresponding to the specific position on the exercise equipment corresponding to each of the film pressure sensing elements of each of the at least one film pressure sensing device, and when each of the film pressure sensing elements of each of the at least one film pressure sensing device senses the pressure to generate the pressure sensing signal, the display interface changes a state of the corresponding object on the calibration image.

10. The pressure sensing system of claim 9, wherein for each of the at least one film pressure sensing device, the processing module further comprising:
   a circuit board;
   an input/output (I/O) interface, being disposed on the circuit board and having a plurality of VCC pins and a GND pin to be electrically connected to the film pressure sensing elements via the conducting wires;
   a transceiver, being disposed on the circuit board; and
   a processor, being disposed on the circuit board and electrically connected to the I/O interface and the transceiver, and being configured to receive the pressure sensing signals from the film sensing elements through the I/O interface, generate the sensing data according to the pressure sensing signals, and transmit the sensing data to the electronic device through the transceiver.

11. The pressure sensing system of claim 10, wherein for each of the at least one film pressure sensing device, the film sensing module further comprises an insulating layer, the insulating layer has a first surface and a second surface, each of the film pressure sensing elements has a first conductive layer disposed on the first surface of the insulating layer and a second conductive layer disposed on the second surface opposite to the first conductive layer, the first conductive layer of each of the film pressure sensing elements is electrically connected to one of the VCC pins, and the second conductive layer of each of the film pressure sensing elements is electrically connected to the GND pin.

12. The pressure sensing system of claim 10, wherein for each of the at least one film pressure sensing device, the transceiver of the processing module is a Bluetooth transceiver for transmitting the sensing data to the electronic device.

13. The pressure sensing system of claim 9, wherein for each of the at least one film pressure sensing device, each of the film pressure sensing elements of the film sensing module is a capacitive pressure sensing element.

14. The pressure sensing system of claim 9, wherein the electronic device executes an application program, and the application program generates a control command according to the sensing data received from each of the at least one film pressure sensing device.

15. The pressure sensing system of claim 14, wherein the application program of the electronic device generates an animation for a moving bike, and the control command is used to control a turning angle of the moving bike.

16. The pressure sensing system of claim 14, wherein the application program of the electronic device generates an animation for a moving bike, and the control command is used to control a lean angle of the moving bike when the bike is turning.

\* \* \* \* \*